(12) United States Patent
Butler et al.

(10) Patent No.: US 7,227,614 B2
(45) Date of Patent: Jun. 5, 2007

(54) MEASUREMENT METHOD, DEVICE MANUFACTURING METHOD AND LITHOGRAPHIC APPARATUS

(75) Inventors: Hans Butler, Best (NL); Martinus Godefridus Helena Boogaarts, Sint-Michielsgestel (NL)

(73) Assignee: ASML Netherlands B.V., Veldhoven (NL)

( * ) Notice: Subject to any disclaimer, the term of this patent is extended or adjusted under 35 U.S.C. 154(b) by 202 days.

(21) Appl. No.: 10/986,180

(22) Filed: Nov. 12, 2004

(65) Prior Publication Data
US 2006/0103819 A1   May 18, 2006

(51) Int. Cl.
*G03B 27/42* (2006.01)
(52) U.S. Cl. ............................. 355/53; 355/72; 355/75
(58) Field of Classification Search ................... 355/53, 355/72, 75
See application file for complete search history.

(56) References Cited

U.S. PATENT DOCUMENTS

| | | | | |
|---|---|---|---|---|
| 6,233,040 B1* | 5/2001 | Sekiguchi | ..................... | 355/53 |
| 6,493,062 B2* | 12/2002 | Tokuda et al. | ................ | 355/53 |
| 2005/0012912 A1* | 1/2005 | Draaijer et al. | ................ | 355/52 |
| 2005/0139790 A1* | 6/2005 | Boogaarts et al. | .......... | 250/548 |

* cited by examiner

*Primary Examiner*—D. Rutledge
(74) *Attorney, Agent, or Firm*—Pillsbury Winthrop Shaw Pittman, LLP

(57) ABSTRACT

To increase a measurement range of a measurement system taking measurement samples of an object moving with respect to said measurement system, the measurement system is configured to take measurement samples at different sample positions while the object accelerates with respect to the measurement system. In particular, a measurement timing for taking samples is determined corresponding to a selected acceleration and velocity of the object as a function of time with respect to the measurement system.

27 Claims, 4 Drawing Sheets

MEASUREMENT METHOD, DEVICE MANUFACTURING METHOD AND LITHOGRAPHIC APPARATUS

FIELD

The present invention relates to lithographic apparatus and methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Before exposure of the substrate to transfer the pattern onto the substrate, a height level of the substrate may be determined and mapped. A resulting height map of the substrate may be employed to position the substrate with respect to a projection system, for example.

In a conventional lithographic apparatus, the height map may be generated by sampling the height of the substrate at predetermined equidistant positions, e.g. positions lying on a rectangular measurement grid. A height level sensor and the substrate may be moved with respect to each other along a trajectory, which trajectory is selected along the predetermined positions. In the conventional lithographic apparatus, the measurement samples are taken while the substrate and the height level sensor move with respect to each other at a constant velocity. Thus, the height level sensor samples the equidistant measurement positions by sampling at a constant sampling rate. It is noted that in the measuring process the substrate or the height level sensor or both may move.

Before reaching a constant velocity a moving part, e.g. the substrate, first needs to accelerate. While accelerating, no samples are taken. The acceleration is performed over a run-in distance, i.e. a first part of a measurement trajectory. Over the run-in distance, to obtain a full map of the substrate, the height level sensor and the substrate are not positioned with respect to each other such that samples may be taken, i.e. the run-in distance may be positioned outside a substrate measurement area. In a second part of the measurement trajectory, the velocity may be constant. The second part of the measurement trajectory is positioned in the substrate measurement area such that the height level sensor may take samples at the predetermined positions. Next, during a third part of the measurement trajectory positioned outside the substrate measurement area, no samples are taken and the moving part, e.g. the substrate, may decelerate. The above-described sampling method, i.e. accelerating; sampling, while moving at a constant velocity; and decelerating, may be repeated, until a sample has been taken at every predetermined position.

In the above-described method, a run-in distance may be required to reach a predetermined constant velocity before sampling. The moving part needs to move over a moving distance that is larger than a required sampling distance. To decrease a measurement time period, a higher measurement velocity may be required. For a higher measurement velocity, however, a larger run-in distance may be required and therefore the moving distance should be larger. Such a larger moving distance may require additional space in the apparatus, and may require additional time for the completion of the measuring process.

SUMMARY

It is desirable to decrease a measurement period of the measurement sampling method without increasing a moving distance of a moving part.

According to an embodiment of the invention, there is provided a method for taking measurement samples of an object at predetermined positions using a measurement system, the method including selecting a measurement trajectory along the predetermined positions, the object and the measurement system being moveable with respect to each other along the trajectory; selecting an acceleration and a velocity of the measurement system and the object with respect to each other as a function of time; and determining a measurement sample timing such that the measurement samples are taken at the predetermined positions, wherein at least one measurement sample is taken at a point in time at which the substrate and the measurement system accelerate with respect to each other.

In another embodiment of the invention, there is provided a method for taking measurement samples of an object at different positions using a measurement system, the method including: selecting a measurement trajectory along the positions, wherein relative movement between the object and the measurement system takes place along the trajectory; selecting a dynamic value of movement between the measurement system and the object; and determining a measurement sample timing such that the measurement samples are taken at the positions, wherein a measurement sample is taken at a point in time at which the substrate and the measurement system accelerate with respect to each other.

In an embodiment of the invention, the dynamic value of movement is acceleration. In another embodiment of the invention, the dynamic value of movement is velocity.

According to an embodiment of the invention, there is provided a device manufacturing method including transferring a pattern from a patterning device onto a substrate, wherein a height level of a surface of the substrate is sampled at predetermined positions, the method including selecting a measurement trajectory along the predetermined positions, the object and the measurement system being moveable with respect to each other along the measurement trajectory; selecting an acceleration and a velocity of the measurement system and the object with respect to each other as a function of time; and determining a measurement sample timing such that the measurement samples are taken at the predetermined positions, wherein at least one measurement sample is taken at a point in time at which the substrate and the measurement system accelerate with respect to each other.

In an another embodiment of the invention, there is provided a device manufacturing method including transferring a pattern from a patterning device onto a substrate, wherein a height level of a surface of the substrate is sampled at different positions, the method including: selecting a measurement trajectory along the positions, wherein relative movement between the object and the measurement system takes place along the measurement trajectory; selecting a dynamic value of movement between the measurement system and the object; and determining a measurement sample timing such that the measurement samples are taken at the positions, wherein a measurement sample is taken at a point in time at which the substrate and the measurement system accelerate with respect to each other.

According to an embodiment of the invention, there is provided a lithographic apparatus arranged to transfer a pattern from a patterning device onto a substrate, the apparatus including a measurement system for taking measurement samples of the substrate at predetermined positions; an actuator system for moving the substrate and the measurement system with respect to each other; and a control system operatively coupled to the actuator system and the measurement system, wherein the control system is configured to control the measurement system to take a measurement sample at a point in time at which the substrate and the measurement system accelerate with respect to each other such that a measurement sample is taken at one of the predetermined positions.

In yet another embodiment of the invention, there is provided a lithographic apparatus arranged to transfer a pattern from a patterning device onto a substrate, the apparatus including: a measurement system configured to take measurement samples of the substrate at different positions; an actuator system configured to move a first of the substrate and the measurement system relative to a second of the substrate and the measurement system; and a control system operatively coupled to the actuator system and the measurement system; wherein the control system is configured to control the measurement system to take a measurement sample at a point in time at which the substrate and the measurement system accelerate with respect to each other such that a measurement sample is taken at one of the positions.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
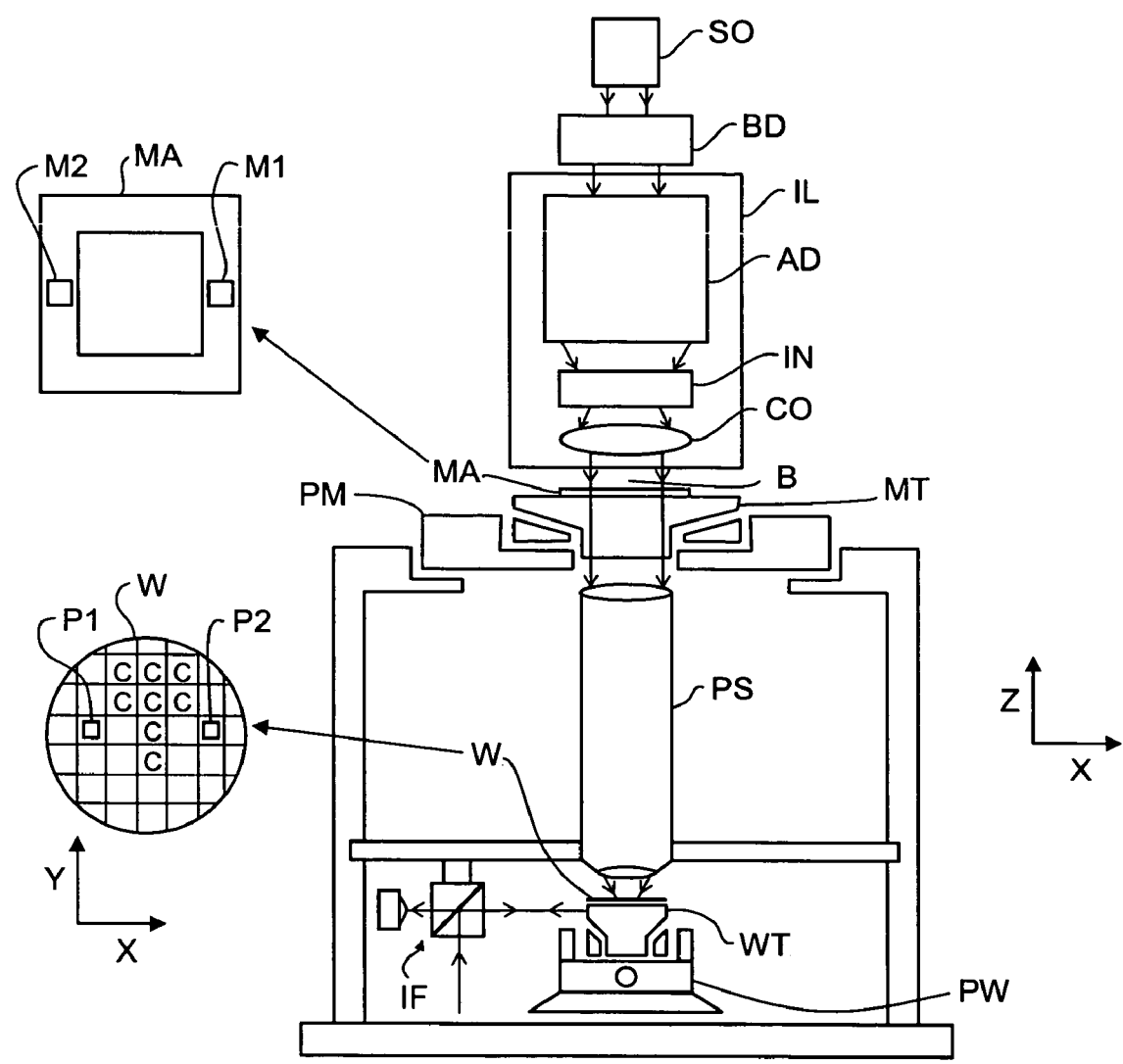
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation) and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2A:
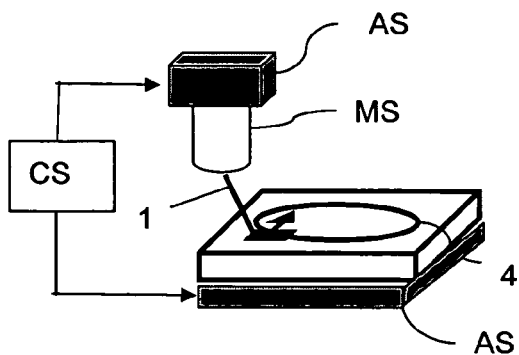
FIGS. 2A, 2B, and 2C schematically illustrate a measurement trajectory.

FIG. 2A schematically illustrates a height measurement of a substrate 4 using a height level measurement system MS. Using a beam of radiation 1, a local height of the substrate 4 may be determined contact-free. Embodiments of the present invention are however not limited to height level measurements only; any other measurement may as well be performed. FIG. 2A also shows an actuator system AS configured to move a first of the substrate and the measurement system relative to a second of the substrate and the measurement system, and a control system CS.

Figure 2B:
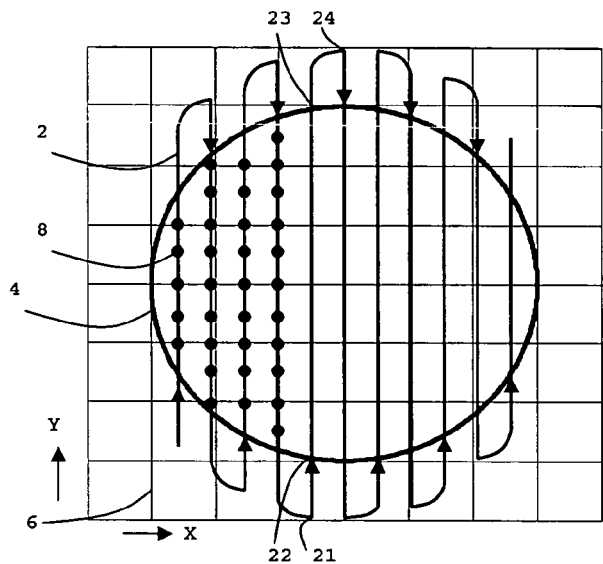

FIG. 2B illustrates a measurement trajectory 2 for mapping e.g. a height level of the substrate 4. In the illustrated method, it is presumed that the substrate 4 may move with respect to a measurement sensor. In another embodiment, however, the substrate may be stationary and the measurement sensor may move, or both may move. A virtual grid 6 having an X-direction and a Y-direction is shown. The size of the illustrated grid 6 is deemed to indicate a maximum moving range of the substrate 4 with respect to the measurement sensor. To map the height of the substrate 4, the substrate 4 is moved with respect to the measurement sensor such that the measurement sensor follows the indicated measurement trajectory 2 in a direction indicated by arrows 2A to obtain measurement samples at predetermined positions 8.

The measurement trajectory 2 may be divided in a number of straight trajectories, e.g. 11 straight trajectories as shown. In a first part of each straight trajectory, indicated by reference numerals 21–22, the substrate 4 may accelerate. In a second part, indicated by reference numerals 22–23, the substrate 4 may have a constant velocity and in a third part, indicated by reference numerals 23–24, the substrate 4 may decelerate and turn to start a next straight trajectory.

In conventional lithographic apparatus, the measurement sensor is to sample the height of the substrate 4 at equidistant predetermined positions 8 and the measurement sensor samples at a constant sampling rate. Therefore, it is desirable that the substrate 4 moves with a constant velocity during sampling. To obtain a full map of the substrate 4, the substrate 4 accelerates when the measurement sensor is not positioned for sampling, i.e. during the first part 21–22, also known as a run-in distance, of each straight trajectory, which lies outside a measurement area of the substrate 4. The second part 22–23 of each straight trajectory lies over the substrate 4. The third part 23–24 lies outside the measurement area of the substrate 4 again.

Figure 2C:
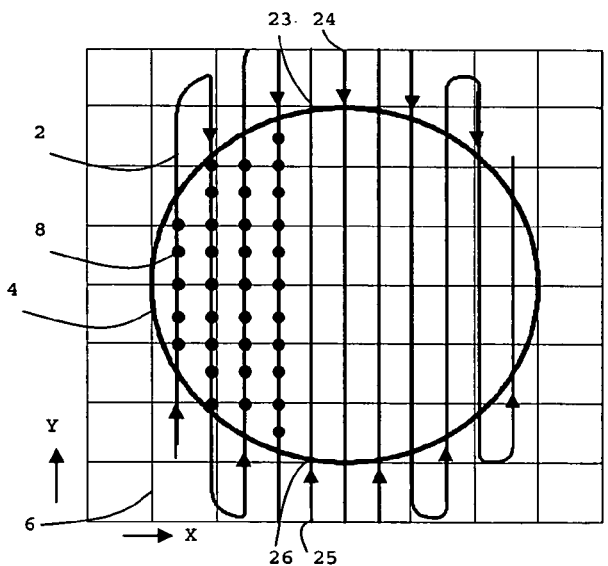

Due to the limited moving range of the substrate 4 as indicated by grid 6, there is only limited run-in distance. Thus, a velocity of the substrate 4 is limited to a maximum velocity due to the limited moving range. If a higher constant velocity would be desired, a larger run-in distance would be required. This is illustrated in FIG. 2C in which the run-in distance indicated by reference numerals 25–26 is shorter than the run-in distance 21–22, and therefore, the substrate 4 cannot reach the desired velocity in time at point 26.

Figure 3:
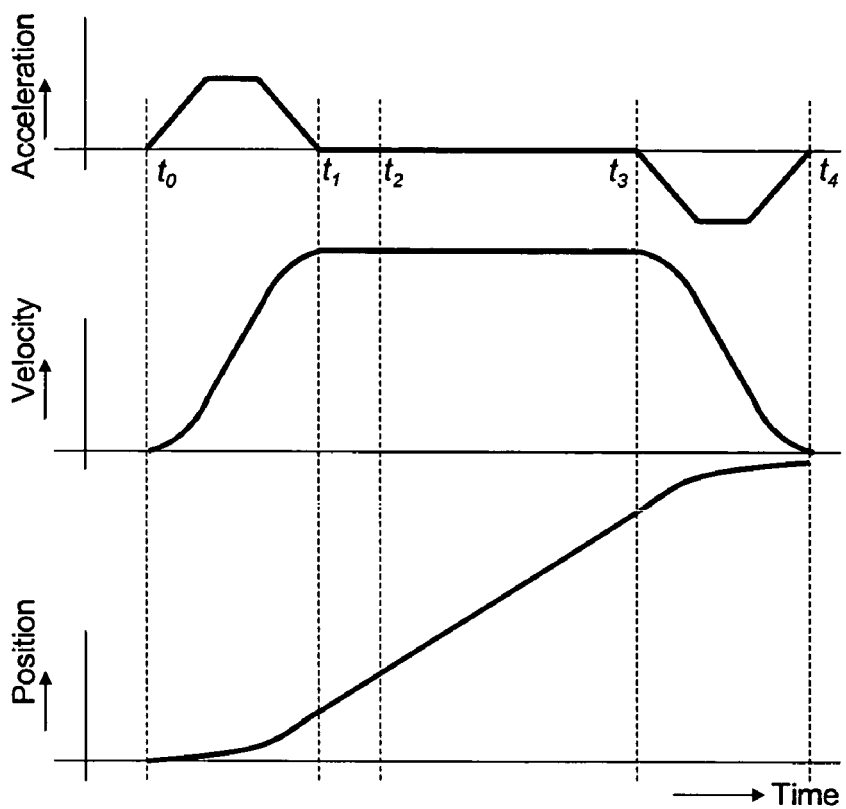
FIG. 3 shows timing charts of a conventional scanning measurement method.

FIG. 3 illustrates a timing of each above-mentioned straight trajectory in the conventional lithographic apparatus. The position, velocity and acceleration of the substrate with respect to the measurement sensor are shown as a function of time. At a beginning of a straight trajectory (e.g. at reference numeral 21 in FIG. 2B), the substrate 4 may be in standstill, i.e. position, velocity and acceleration are zero.

At $t_0$, the substrate starts to accelerate and the acceleration increases linearly up to a maximum acceleration and later decreases to zero acceleration again. Thus, the velocity simultaneously increases from zero to a maximum velocity. At $t_1$, the acceleration has become zero and the system may settle during a settling time $t_1$–$t_2$. Settling may be required due to a relatively large jerk resulting from the selected acceleration as a function of time.

At $t_2$, the measurement sensor has reached reference numeral 22 (FIG. 2) and the substrate moves with a constant velocity, the position increasing linearly in time. As the measurement sensor samples at a constant sampling rate, samples are taken at equidistant positions. At $t_3$, reference numeral 23 (FIG. 2) is reached and the substrate starts to decelerate, i.e. accelerate with a negative value, until reference numeral 24 is reached at $t_4$. Then, the method may start again at $t_0$ and is repeated until the substrate is mapped.

Since it is desired to shorten the total measurement period, and thus it is desired to increase the maximum velocity, without increasing the run-in distance, it is proposed to sample while the substrate accelerates.

Figure 4:
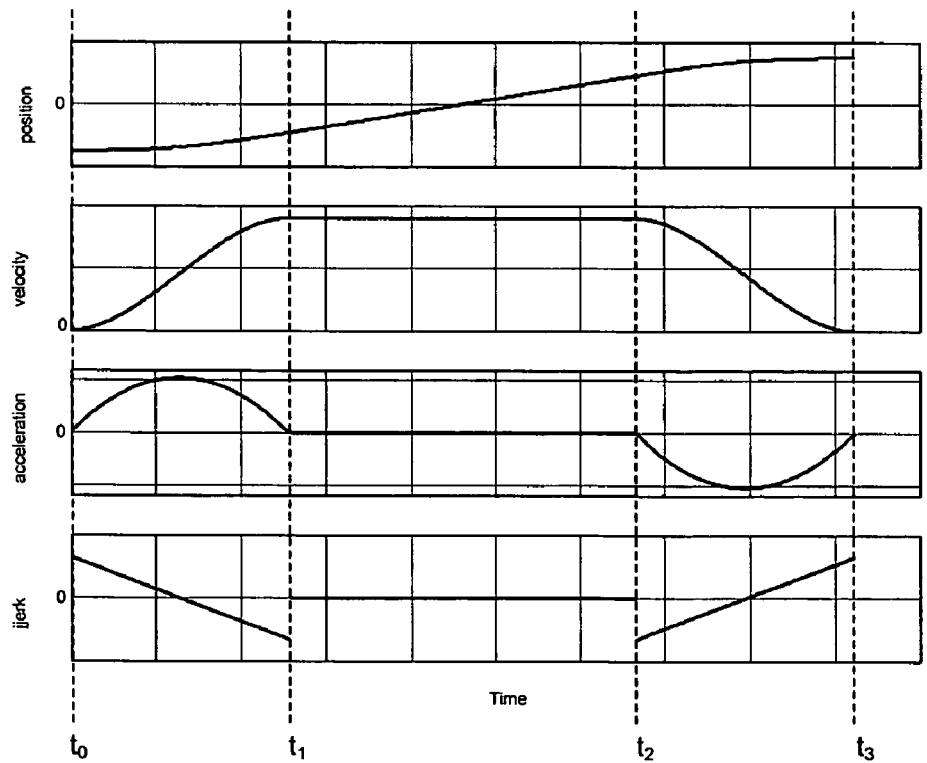
FIG. 4 shows timing charts of a scanning measurement method according to an embodiment of the present invention.

In a first method according to an embodiment of the present invention, the first part of each straight trajectory as described in relation to FIG. 2 may start at a border of a measurement area of the substrate. Such a method is illustrated in FIG. 4. Referring to FIG. 4, the position, velocity, acceleration and jerk of the substrate relative to the measurement sensor are shown as a function of time.

At $t_0$, the substrate may be in standstill and is positioned with respect to the measurement sensor such that the measurement sensor may start to sample. At $t_0$, the substrate starts to accelerate in accordance with a selected acceleration function. Due to the acceleration, the velocity increases and the position increases. During the acceleration period, the measurement sensor may take samples, i.e. measurements at predetermined positions. However, these samples may have to be taken at points in time having non-equal periods of time therebetween. Therefore, it needs to be determined when to take a measurement sample, instead of sampling at a constant sampling rate.

Further, as indicated in FIG. 3 and described in relation to FIG. 3, in the conventional configuration a settling time is used before taking samples to correct for servo errors due to the large acceleration and jerk. In the above-described embodiment according to the present invention, there is no time for settling, since measuring is already started and needs to continue. To omit the settling time, the servo error needs to be decreased. To obtain a relatively small servo error, the jerk needs to be relatively small, thereby generating smooth polynomial functions for the acceleration, velocity and position. Thus, the acceleration function may be selected to be a relatively smooth polynomial function.

In the method illustrated in FIG. 4, the acceleration is selected to be a second order polynomial function of time during the acceleration part of a trajectory. Thus, during that part, the velocity is a third order polynomial function of time and the position is a fourth order polynomial function of time.

During a constant velocity part of a trajectory, the velocity is constant and therefore, after $t_1$, the position is a first order polynomial, i.e. linear function of time. After $t_2$, the substrate decelerates corresponding to a selected second order polynomial function, until the velocity becomes zero again at $t_3$.

In an embodiment of the invention, to determine a timing for taking measurement samples, as mentioned above, the measurement system may include a position measurement system operatively connected to a control system for controlling the measurement sensor. When the sensor is positioned such that a sample may be taken at one of the predetermined measurement positions, the control system may control the sensor to take a measurement sample.

In another embodiment, the measurement timing may be predetermined by an inversion of the position as a function of time. In the method illustrated in FIG. 4, the function is a fourth order polynomial function during the acceleration and deceleration of the substrate and a first order polynomial function during the constant velocity part. Both polynomial functions may be analytically inverted. After inversion, a timing function results, which function provides a time as a function of a position, thus with the timing function, the predetermined measurement positions may be converted to predetermined measurement points in time.

Figure 5:
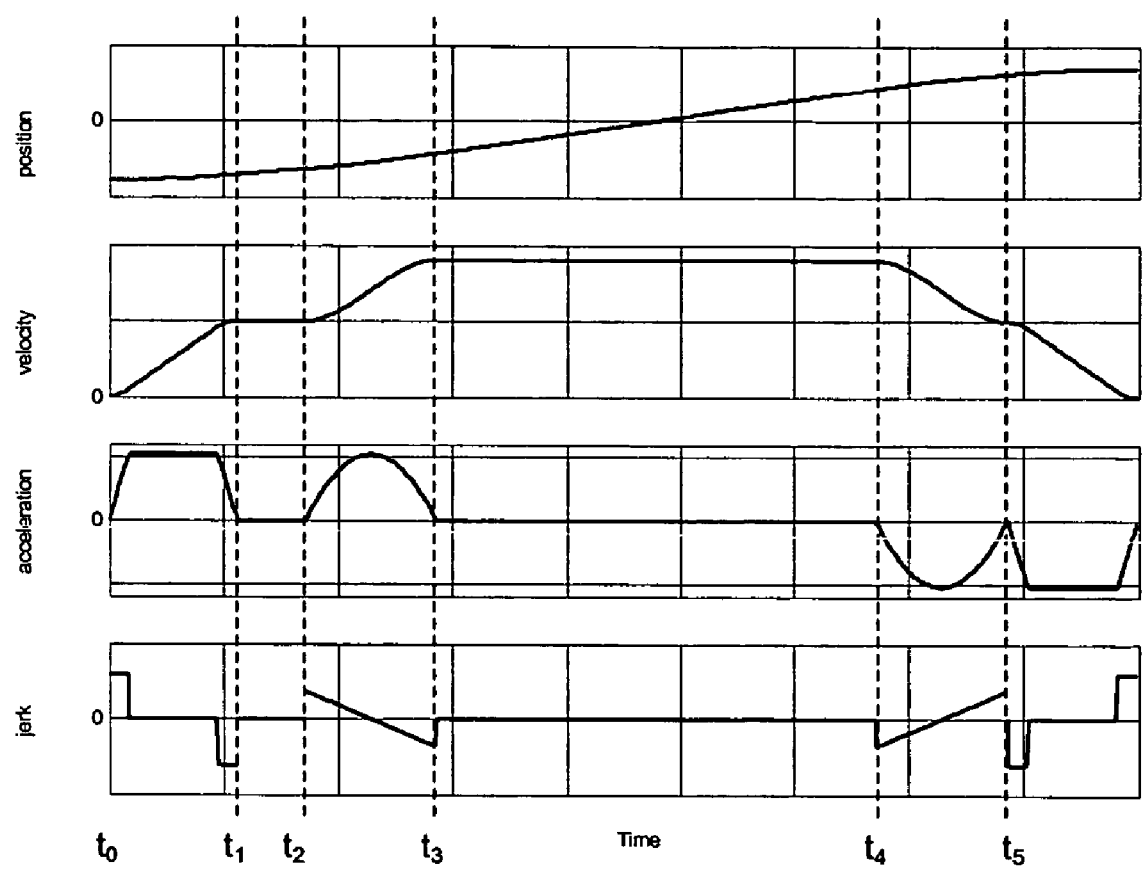
FIG. 5 shows timing charts of a scanning measurement method according to an embodiment of the present invention.

FIG. 5 shows timing diagrams according to another method according to an embodiment of the present invention. Referring to FIG. 5, the position, velocity, acceleration and jerk of the substrate relative to the measurement sensor are shown as a function of time. In the method according to FIG. 5, at $t_0$, the substrate accelerates to a predetermined velocity before the measurement sensor starts to sample. At $t_1$, the substrate has reached the predetermined velocity and the system settles during a settling time. After the settling time, at $t_2$, the measurement sensor may start to take measurement samples, while the substrate accelerates further corresponding to a selected acceleration function. At $t_3$, the velocity becomes constant and, at $t_4$, the substrate decelerates corresponding to a selected deceleration function, while the measurement samples are still being taken.

At $t_5$, the measurements are completed for the corresponding part of the measurement trajectory. The velocity may have been decreased to zero or may have been decreased to another predetermined velocity as shown in FIG. 5. In the latter case, after $t_5$, the substrate may decelerate further to zero. It is noted that during the acceleration from $t_2$ to $t_3$ and during the deceleration from $t_4$ to $t_5$, the maximum absolute value of the jerk is smaller than the maximum absolute value of the jerk during the acceleration from $t_0$ to $t_1$ and during the deceleration after $t_5$, respectively. A small jerk keeps servo errors small as mentioned above in relation to the method illustrated in FIG. 4.

Above, it is described that each part of a measurement trajectory includes a first part for accelerating, a second part for moving at a constant velocity and a third part for decelerating. However, if measurement samples are taken during acceleration and deceleration, the second part may be omitted. A part of the measurement trajectory may be too short for the substrate to reach a desired maximum velocity, to move at the maximum velocity and to decelerate thereafter. Thus, the first part for acceleration may end before the maximum velocity is reached and may be immediately followed by the third part for deceleration. In a further embodiment, for each measurement trajectory part the acceleration may be persevered to reach any maximum velocity and be immediately followed by a deceleration part.

In the above description the present invention has been described in use for moving an object to be measured in a plane such that a distance between the object and a measurement sensor is kept substantially constant. However, the present invention may as well be employed for moving the object in any other direction, e.g. towards or away from the measurement sensor. For example, a height level sensor may have a limited measurement range. A surface of an object to be measured may be required to be positioned in the measurement range. Taking measurement samples while moving the surface possibly from outside the measurement range into the measurement range, makes it possible to collect measurement data, and thereafter determine which measurement data correspond to data collected while the surface was positioned in the measurement range. The present invention enables to accelerate the object while taking measurement samples.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for taking measurement samples of an object at different positions using a measurement system, the method comprising:

selecting a measurement trajectory along said positions, wherein relative movement between said object and said measurement system takes place along said trajectory;

selecting a dynamic value of movement between the measurement system and the object; and determining a measurement sample timing such that said measurement samples are taken at said positions, wherein a measurement sample is taken at a point in time at which the substrate and the measurement system accelerate with respect to each other.

2. The method of claim 1, wherein said measurement trajectory includes an acceleration trajectory and a deceleration trajectory, and wherein determining a measurement sample timing comprises:

determining an acceleration function, thereby providing a relative position of the measurement system and the object as a function of time during the acceleration trajectory;

inverting the acceleration function to obtain an acceleration timing function, thereby providing a timing as a function of said relative position of the measurement system and the object during the acceleration trajectory;

determining a deceleration function, thereby providing a relative position of the measurement system and the object as a function of time during the deceleration trajectory;

inverting the deceleration function to obtain a deceleration timing function, thereby providing a timing as a function of said relative position of the measurement system and the object during the deceleration trajectory; and determining measurement points in time corresponding to said positions using the acceleration timing function and the deceleration timing function.

3. The method of claim 2, wherein said acceleration function is a polynomial function.

4. The method of claim 3, wherein the polynomial acceleration function is a second order polynomial function, a corresponding position function of said polynomial acceleration function being a fourth order polynomial function.

5. The method of claim 2, wherein said deceleration function is a polynomial function.

6. The method of claim 5, wherein the polynomial deceleration function is a second order polynomial function, a corresponding position function of said polynomial deceleration function being a fourth order polynomial function.

7. The method of claim 2, wherein said measurement trajectory includes said acceleration trajectory, a constant velocity trajectory and said deceleration trajectory, and wherein determining a measurement sample timing further comprises:

determining a constant velocity function indicating a relative position of the measurement system and the object as a function of time during the constant velocity trajectory; inverting the constant velocity function to obtain a constant velocity timing function indicating a timing as a function of said relative position of the measurement system and the object during the constant velocity trajectory; and determining measurement points in time corresponding to said predetermined positions using the acceleration timing function, the constant velocity timing function and the deceleration timing function.

8. The method of claim 7, wherein said constant velocity function is a polynomial function.

9. The method of claim 8, wherein the polynomial constant velocity function is a constant, a corresponding position function of said velocity function being a first order polynomial function.

10. The method of claim 1, wherein the positions lie at equidistant positions along a part of said measurement trajectory.

11. The method of claim 10, wherein the positions lie on a rectangular grid.

12. The method of claim 1, wherein the measurement system is configured to measure a height level of a surface of said object, the method further comprising:

sampling a height level of a surface of said object at measurement points in time corresponding to said measurement sample timing.

13. The method of claim 1, wherein determining a measurement sample timing comprises determining a relative position of the measurement system and the substrate in order to take a measurement sample, when said relative position equals one of said positions.

14. The method of claim 1, wherein the dynamic value is acceleration.

15. The method of claim 1, wherein the dynamic value is velocity.

16. The method of claim 1, wherein only said object moves.

17. The method of claim 1, wherein only said measurement system moves.

18. The method of claim 1, wherein said object and said measurement both move.

19. A device manufacturing method comprising transferring a pattern from a patterning device onto a substrate, wherein a height level of a surface of said substrate is sampled at different positions, the method comprising:

selecting a measurement trajectory along said positions, wherein relative movement between said object and said measurement system takes place along said measurement trajectory;

selecting a dynamic value of movement between the measurement system and the object; and determining a measurement sample timing such that said measurement samples are taken at said positions, wherein a measurement sample is taken at a point in time at which the substrate and the measurement system accelerate with respect to each other.

20. The method of claim 19, wherein the dynamic value is acceleration.

21. The method of claim 19, wherein the dynamic value is velocity.

22. A lithographic apparatus arranged to transfer a pattern from a patterning device onto a substrate, the apparatus comprising:

a measurement system configured to take measurement samples of the substrate at different positions on the substrate;

an actuator system configured to move one of the substrate and the measurement system relative to the other one of the substrate and the measurement system; and a control system operatively coupled to the actuator system and the measurement system;

wherein the control system is configured to control the measurement system to take a measurement sample at a point in time at which the substrate and the measurement system accelerate with respect to each other such that a measurement sample is taken at one of said positions.

23. The lithographic apparatus of claim 22, wherein the control system is operatively coupled to a position measurement system configured to determine a relative position of the measurement system and the substrate, the control system being configured to control the measurement system to take a measurement sample, when said relative position equals one of said positions.

24. The lithographic apparatus of claim 22, wherein the control system comprises a memory, the memory storing measurement points in time, the measurement points in time being determined corresponding to said positions and a selected acceleration and velocity as a function of time.

25. The lithographic apparatus of claim 22, wherein the actuator system moves the substrate and wherein the measurement system is stationary.

26. The lithographic apparatus of claim 22, wherein the actuator system moves the measurement system and wherein the substrate is stationary.

27. The lithographic apparatus of claim 22, wherein the measurement system and the substrate both move.

* * * * *